(12) United States Patent
Ozaki et al.

(10) Patent No.: US 8,043,431 B2
(45) Date of Patent: Oct. 25, 2011

(54) SUBSTRATE PROCESSING APPARATUS AND METHOD FOR MANUFACTURING A SEMICONDUCTOR DEVICE

(75) Inventors: Takashi Ozaki, Tokyo (JP); Tomoshi Taniyama, Tokyo (JP); Hiroshi Unami, Tokyo (JP); Kiyohiko Maeda, Tokyo (JP); Shinya Morita, Tokyo (JP); Yoshikazu Takashima, Tokyo (JP); Sadao Hisakado, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 75 days.

(21) Appl. No.: 12/382,082

(22) Filed: Mar. 9, 2009

(65) Prior Publication Data
US 2009/0188431 A1    Jul. 30, 2009

Related U.S. Application Data

(62) Division of application No. 10/528,137, filed as application No. PCT/JP2004/001996 on Feb. 20, 2004.

(30) Foreign Application Priority Data

| Feb. 21, 2003 | (JP) | 2003-044049 |
| Feb. 21, 2003 | (JP) | 2003-044904 |
| Mar. 27, 2003 | (JP) | 2003-087884 |
| Mar. 27, 2003 | (JP) | 2003-087966 |

(51) Int. Cl.
*H01L 21/205* (2006.01)
*H01L 21/316* (2006.01)

(52) U.S. Cl. ...... 118/715; 432/237; 432/244; 219/444.1

(58) Field of Classification Search .......... 432/247, 432/244, 250, 237; 219/390, 443.1, 444.1; 118/715
See application file for complete search history.

(56) References Cited

U.S. PATENT DOCUMENTS
5,162,047 A    11/1992    Wada et al. ............ 29/25.01
(Continued)

FOREIGN PATENT DOCUMENTS
EP    1 152 461    11/2001
(Continued)

OTHER PUBLICATIONS

Machine Generated English Translation of JP 2002-110562 published Apr. 12, 2002.*

(Continued)

*Primary Examiner* — Sylvia R. MacArthur
(74) *Attorney, Agent, or Firm* — Kratz, Quintos & Hanson, LLP (57) ABSTRACT

A CVD device has a reaction furnace (39) for processing a wafer (1); a seal cap (20) for sealing the reaction furnace (39) hermetically; an isolation flange (42) opposite to the seal cap (20); a small chamber (43) formed by the seal cap (20), the isolation flange (42), and the wall surface in the reaction furnace (39); a feed pipe (19b) for supplying a first gas to the small chamber (43); an outflow passage (42a) provided in the small chamber (43) for allowing the first gas to flow into the reaction furnace (39); and a feed pipe (19a) provided downstream from the outflow passage (42a) for supplying a second gas into the reaction furnace (39). Byproducts such as NH4Cl are prevented from adhering to low temperature sections such as the furnace opening and therefore the semiconductor device production yield is therefore increased.

9 Claims, 9 Drawing Sheets

U.S. PATENT DOCUMENTS

| | | | |
|---|---|---|---|
| 5,478,397 A * | 12/1995 | Shibata et al. | 118/724 |
| 5,482,559 A | 1/1996 | Imai et al. | 118/728 |
| 6,238,488 B1 | 5/2001 | Fujita et al. | 134/18 |
| 6,953,739 B2 * | 10/2005 | Yang et al. | 438/488 |
| 2002/0094502 A1 | 7/2002 | Kogano et al. | 432/242 |
| 2006/0150904 A1 | 7/2006 | Ozaki et al. | 118/715 |

FOREIGN PATENT DOCUMENTS

| | | |
|---|---|---|
| JP | 07-006965 | 1/1995 |
| JP | 08-115883 | 5/1996 |
| JP | 09-092627 | 4/1997 |
| JP | 11-121389 | 4/1999 |
| JP | 2000-223432 | 8/2000 |
| JP | 2002-110562 | 4/2002 |
| JP | 2002-280373 | 9/2002 |

OTHER PUBLICATIONS

Japanese Office Action dated Jun. 7, 2011 issued in counterpart application No. 2008-200033 with English translation (6 pages).

* cited by examiner

SUBSTRATE PROCESSING APPARATUS AND METHOD FOR MANUFACTURING A SEMICONDUCTOR DEVICE

RELATED APPLICATION

This application is a division of U.S. patent application Ser. No. 10/528,137, filed Dec. 12, 2005, which application is a 35 U.S.C. 371 of International Application No. PCT/JP04/01996, filed Feb. 20, 2004, which application claims priority of Japanese Application No. 2003-44049, filed Feb. 21, 2003, Japanese Application No. 2003-44904, filed Feb. 21, 2003, Japanese Application No. 2003-87966, filed Mar. 27, 2003, and Japanese Application No. 2003-87884, filed Mar. 27, 2003, all of which are incorporated herein by reference.

FIELD OF THE INVENTION

The present invention relates to a substrate processing apparatus for processes such as forming thin films on substrates including semiconductor substrates and glass substrates, and a manufacturing method for semiconductor devices including processes such as forming thin films on substrates.

BACKGROUND ART

In upright thermal CVD device that performs processes such as forming $Si_3N_4$ film on the multiple substrates by utilizing dichlorosilane ($SiH_2Cl_2$) and ammonia ($NH_3$), other than the silicon nitride ($Si_3N_4$) film comprising the target film, byproducts such as ammonium chloride ($NH_4Cl$) are generated and adhere to low temperature sections such as the wall surface inside the furnace opening at the lower section of the reaction furnace. These adhering byproducts are a source of particles and create problems. One method for resolving this problem is a technique for heating low temperature sections such as the furnace opening on the lower section of the reaction furnace to an extent where the byproducts will not adhere (see for example Japanese Patent Non-Examined Publication No. 2002-184769).

However, there are temperature limits even on this heating method due to the O-ring for sealing between the reaction furnace and the furnace opening seal cap for sealing the reaction furnace, and the rotation mechanism for rotating the boat inside the reaction furnace in the vicinity of the furnace opening. Technology is therefore required for preventing byproducts such as $NH_4Cl$ from adhering to low temperature sections such as the furnace opening, without heating.

In order to resolve the above problems with the prior art, the present invention has the object of preventing byproducts such as $NH_4Cl$ from adhering to low temperature sections such as the furnace opening, without applying heat.

DISCLOSURE OF INVENTION

In the present invention, a first gas is supplied to a small chamber (space) formed by covering the upper surface of the seal cap by the cover, and the first gas purges the small chamber by flowing from the small chamber into the reaction furnace, and a second gas is supplied downstream of the first gas flow. The second gas is in this way prevented from flowing into the small chamber so that the generation of byproducts created by the first gas and second gas mixing at a low temperature in the vicinity of the furnace opening of the reaction furnace can be prevented. Byproducts can in this way be prevented from adhering in the vicinity of the furnace opening of the reaction furnace.

Characteristic features of the present invention disclosed in these specifications are as follows.

(1) A substrate processing apparatus comprising: a reaction furnace for processing a substrate; a seal cap for sealing the reaction furnace hermetically; a cover installed separately from the seal cap so as to cover at least a section of the surface of the seal cap facing the inner side of the reaction furnace; a small chamber formed at least by the seal cap and the cover; a feed opening for supplying a first gas to the small chamber; a flow outlet provided in the small chamber for making the first gas flow into the reaction furnace; and a feed opening provided further downstream than the flow outlet, for supplying a second gas into the reaction furnace.

(2) The substrate processing apparatus according to claim 1, wherein the small chamber is formed by the seal cap and the cover and the inner wall surface of the reaction furnace; and the flow outlet is formed by a clearance between the cover and the inner wall surface of the reaction furnace.

(3) The substrate processing apparatus according to claim 2, wherein the reaction furnace includes a process tube, and a furnace opening flange for supporting the process tube; and the small chamber is formed by the seal cap and the cover and the inner wall surface of the furnace opening flange; and the flow outlet is formed by a clearance between the inner wall surface of the furnace opening flange and the cover.

(4) The substrate processing apparatus according to claim 3, wherein the furnace opening flange includes an inlet flange for supporting the process tube, and a base flange for supporting the inlet flange; and the small chamber is formed by the inner wall surface of the base flange and the cover and the seal cap; and the flow outlet is formed by a clearance between the inner wall surface of the base flange and the cover.

(5) The substrate processing apparatus according to claim 4, wherein the feed opening for supplying the first gas is provided in the base flange; and the feed opening for supplying the second gas is provided in the inlet flange.

(6) The substrate processing apparatus according to claim 1, wherein the cover is formed by a plate-shaped member.

(7) The substrate processing apparatus according to claim 1, comprising a boat for holding multiple substrates approximately horizontally at intervals in multiple stages, and a rotation mechanism for supporting and rotating the boat by way of a rotating shaft penetrating through the seal cap, wherein the cover is installed in the rotating shaft.

(8) The substrate processing apparatus according to claim 1, wherein the first gas is ammonia, the second gas is dichlorosilane, and a silicon nitride film is formed on the substrate by the thermal CVD method in the processing.

(9) A substrate processing apparatus comprising: a reaction furnace for processing a substrate; a seal cap for sealing the reaction furnace hermetically; a first cover installed separately from the seal cap so as to cover at least a section of the surface of the seal cap facing the inner side of the reaction furnace; a first small chamber formed by the seal cap and the first cover, a first feed opening for supplying a first gas to the first small chamber; a first flow outlet provided in the first small chamber for making the first gas flow into the reaction furnace; a second cover installed separately from the inner wall surface of the lower section of the reaction furnace so as to cover at least a portion of the inner wall surface of the lower part of the reaction furnace; a second small chamber formed by the second cover and the inner wall surface of the lower part of the reaction furnace; a second feed opening for supplying a second gas to the second small chamber; and a second flow outlet provided in the second small chamber for allowing the second gas to flow into the reaction chamber.

(10) The substrate processing apparatus according to claim 9, wherein a ring-shaped member is installed on the seal cap, the first small chamber is formed by the seal cap and the first cover and the ring-shaped member; and the second small chamber is formed by the inner wall surface of the lower part of the reaction furnace and the second cover and the ring-shaped member.

(11) The substrate processing apparatus according to claim 10, wherein the first flow outlet is formed by a clearance between the first cover and the ring-shaped member; and the second flow outlet is formed by a clearance between the second cover and the ring-shaped member.

(12) The substrate processing apparatus according to claim 11, comprising a boat for holding multiple substrates approximately horizontally at intervals in multiple stages, wherein the reaction furnace includes a process tube comprised of an inner tube and an outer tube, and a furnace opening flange for supporting the process tube; and the first cover is comprised of an end plate on the lower side of the boat, and the second cover is comprised of an extending section of the inner tube extending downwards from the protrusion for installing the inner tube on the furnace opening flange.

(13) The substrate processing apparatus according to claim 9, wherein there is no metal member inside the reaction furnace for mixing the first gas flowing from the first flow outlet with the second gas flowing from the second flow outlet.

(14) The substrate processing apparatus according to claim 9, wherein the first feed opening for supplying the first gas is formed by a clearance between the seal cap and the rotating shaft.

(15) The substrate processing apparatus according to claim 9, wherein the first gas is ammonia, and the second gas is dichlorosilane, and a silicon nitride film is formed on the substrate by the thermal CVD method in the processing.

(16) substrate processing apparatus comprising: a reaction furnace for processing a substrate; a seal cap for sealing the reaction furnace hermetically; a first cover installed separately from the seal cap so as to cover at least a section of the surface of the seal cap facing the inner side of the reaction furnace; a first small chamber formed by the seal cap and the first cover, a first feed opening for supplying a first gas to the first small chamber; a first flow outlet provided in the first small chamber for making the first gas flow into the reaction furnace; a second cover installed separately from the inner wall surface of the lower section of the reaction furnace so as to cover at least a portion of the inner wall surface of the lower part of the reaction furnace; a second small chamber formed by the second cover and the inner wall surface of the lower part of the reaction furnace; a second feed opening for supplying a second gas to the second small chamber; and a second flow outlet provided in the second small chamber for allowing the second gas to flow into the reaction chamber, and a third feed opening provided further downstream than the first flow outlet and the second flow outlet for supplying a third gas into the reaction furnace.

(17) The substrate processing apparatus according to claim 16, wherein the first gas and the second gas are ammonia, and the third gas is dichlorosilane, and a silicon nitride film is formed on the substrate by the thermal CVD method in the processing.

(18) A semiconductor device manufacturing method comprising the steps of: loading a substrate into a reaction furnace; sealing the reaction furnace hermetically with a seal cap; processing the substrate by supplying a first gas into a small chamber formed by the seal cap and a cover installed separately from the seal cap so as to cover at least a section of the surface of the seal cap facing the inner side of the reaction furnace, along with making the first gas flow into the reaction furnace from a flow outlet provided in the small chamber, and supplying a second gas into the reaction furnace from a second feed opening provided further downstream than the flow outlet; and unloading the substrate from the reaction furnace.

(19) A semiconductor device manufacturing method comprising the steps of: loading a substrate into a reaction furnace; sealing the reaction furnace hermetically with a seal cap; processing the substrate by supplying a first gas into a small chamber formed by the seal cap and a first cover installed separately from the seal cap so as to cover at least a section of the surface of the seal cap facing the inner side of the reaction furnace, along with allowing the first gas to flow into the reaction furnace from a flow outlet provided in the small chamber, supplying a second gas into a second small chamber formed by the inner surface of the lower section of the reaction furnace and a second cover installed separately from the inner surface of the lower section of the reaction furnace so as to cover at least a section of the inner surface of the lower section of the reaction furnace, and making the second gas flow into the reaction furnace from a second flow outlet provided in the second chamber; and unloading the substrate from the reaction furnace.

(20) A semiconductor device manufacturing method comprising the steps of: loading a substrate into a reaction furnace; sealing the reaction furnace hermetically with a seal cap; processing the substrate by supplying a first gas into a small chamber formed by the seal cap and a first cover installed separately from the seal cap so as to cover at least a section of the surface of the seal cap facing the inner side of the reaction furnace, along with allowing the first gas to flow into the reaction furnace from a flow outlet provided in the small chamber, supplying a second gas into a second small chamber formed by the inner surface of the lower section of the reaction furnace and a second cover installed separately from the inner surface of the lower section of the reaction furnace so as to cover at least a section of the inner surface of the lower section of the reaction furnace, allowing the second gas to flow into the reaction furnace from a second flow outlet provided in the second chamber, and supplying a third gas into the reaction furnace from further downstream than the first flow outlet and the second flow outlet; and unloading the substrate from the reaction furnace.

BEST MODE FOR CARRYING OUT THE INVENTION

The embodiments of the present invention are next described while referring to the drawings.

Figure 1:
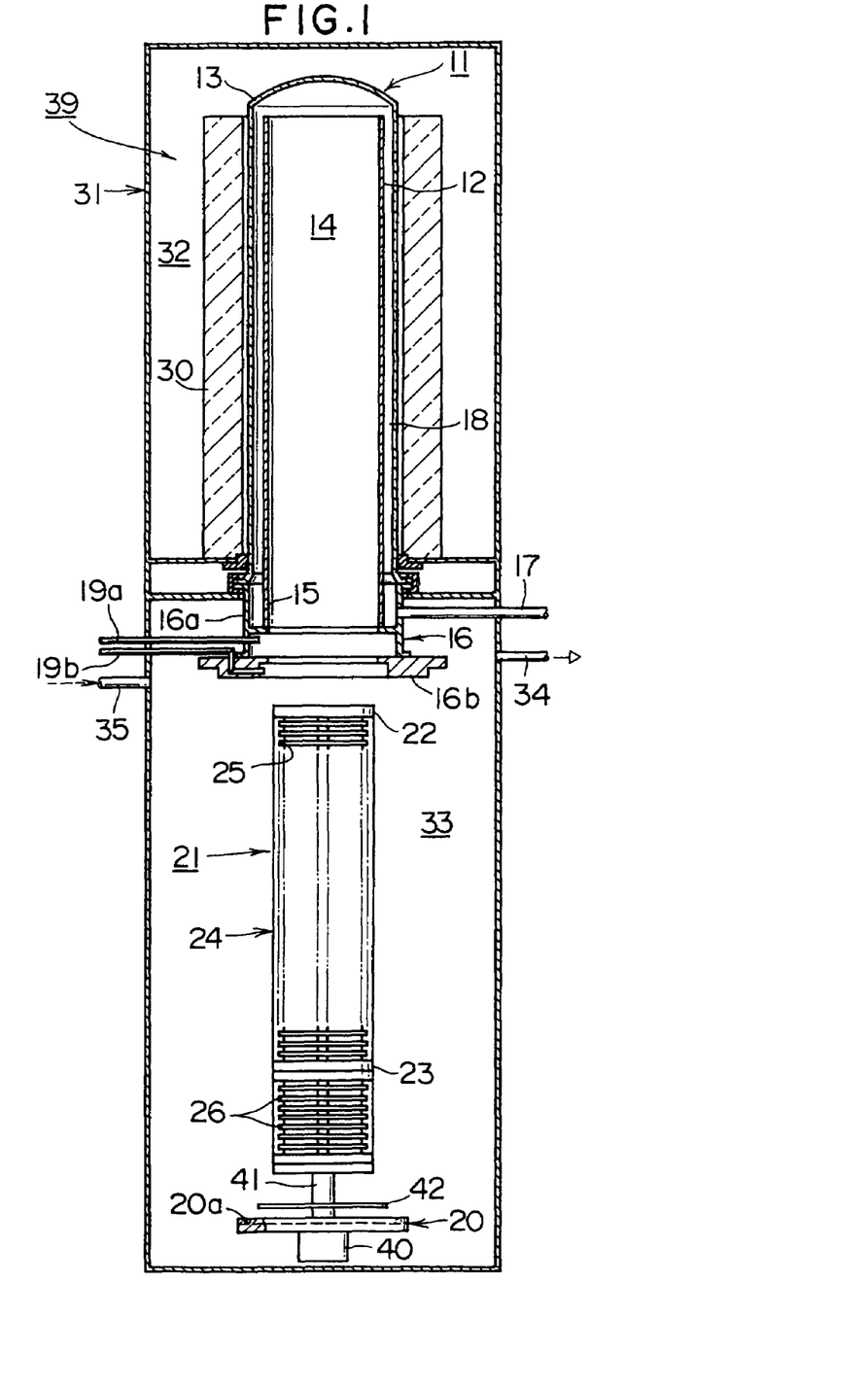
FIG. 1 is a frontal cross sectional view showing the reaction furnace of the substrate processing apparatus of the first embodiment of the present invention.
Figure 2:
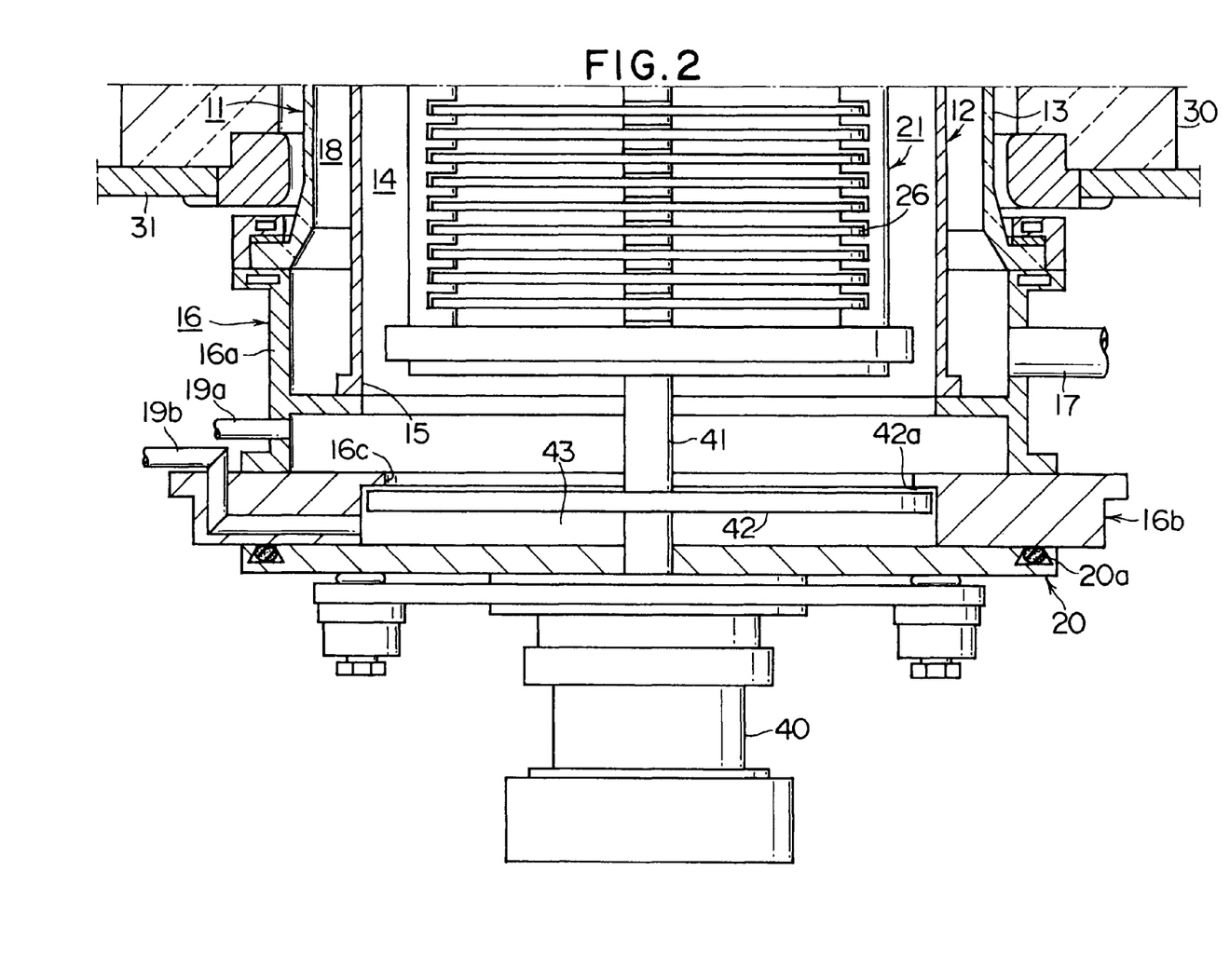
FIG. 2 is a frontal cross sectional view showing the furnace opening in detail.

The CVD device shown in FIG. 1 and FIG. 2 is provided with an upright process tube 11 fixedly installed perpendicular with the vertical center line. This process tube 11 contains an inner tube 12 and an outer tube 13. The inner tube 12 is formed in an integrated tubular shape utilizing quartz glass or silicon carbide (SiC). The outer tube 13 is formed in an integrated tubular shape utilizing quartz glass or silicon carbide. The inner tube 12 is formed in a tubular shape, and the top and bottom are opened. A processing chamber 14 of a reaction furnace 39 loaded with multiple wafers 1 supported in an array vertically by a boat 21 (described later) is formed inside the hollow tube of the inner tube 12. The lower end opening of the inner tube 12 forms a furnace opening 15 for loading and unloading the wafers 1 as the processing substrates. The inside diameter of the inner tube 12 is therefore set to a diameter larger than the maximum outside diameter of the wafers 1. The inside diameter of the outer tube 13 is larger than the outside diameter of the inner tube 12, and is formed in a tubular shape sealed at the top end and open at the bottom end. The inside tube 12 is covered by concentrically by the outer tube 13 that encloses the outer side of the inner tube 12.

The space between the bottom end of the inner tube 12 and the bottom end of outer tube 13 is sealed hermetically by a metallic (for example stainless steel) furnace opening flange 16 formed in a circular ring shape. The furnace opening flange 16 is supported by a case 31 of the CVD device so that the process tube 11 is installed upright. The furnace opening flange 16 is made up of an inlet flange (manifold) 16a for supporting the process tube 11, and a base flange 16b for supporting the inlet flange 16a. The inlet flange 16a and the base flange 16b are both made from metal (for example stainless steel). The inlet flange 16a of the furnace opening flange 16 in FIG. 1 is supported by the case 31, and the base flange 16b is also supported by the case 31 (omitted in FIG. 1 for purposes of simplicity).

An exhaust pipe 17 connected to an exhaust device (not shown in drawing) such as a vacuum pump, is connected to the upper section of the side wall of the furnace opening 16. The exhaust pipe 17 connects to an exhaust path 18 formed by the clearance between the inner tube 12 and the outer tube 13. The cross sectional shape of the exhaust path 18 is a circular ring shape of a fixed width, formed by the clearance between the inner tube 12 and the outer tube 13. The exhaust pipe 17 connects to the furnace opening flange 16 and therefore is arranged at the lowermost edge of the exhaust path 18.

A gas feed pipe 19a at the bottom on the side wall of the inlet flange 16a of the furnace opening flange 16, connects to the furnace opening 15 of the inner tube 12. A supply source (not shown in the drawing) such as for SiH2Cl2 gas or inert gas is connected as the second gas (described later on) to the gas feed pipe 19a. Therefore, the tip opening (blow vent) of the gas feed pipe 19a forms a feed opening for supplying the second gas into the reaction furnace. A gas feed pipe 19b at the bottom on the side wall of the base flange 16b of the furnace opening 16, connects to the furnace opening 15 of the inner tube 12. The gas feed pipe 19b is connected to a supply source (not shown in the drawing) such as for NH3 gas or inert gas as the first gas (described later). The tip opening (blow vent) of the gas feed pipe 19b therefore forms a feed opening for supplying the first gas to the small chamber. The gases that the gas feed pipes 19a, 19b supply to the furnace opening 15 are exhausted from the exhaust pipe 17 via the exhaust path 18 flowing in the processing chamber 14 of inner tube 12.

A metallic (for example stainless steel) seal cap 20 for sealing the processing chamber 14, makes direct contact with the lower end of the base flange 16b of the furnace opening flange 16 from the lower side via an O-ring 20a. The seal cap 20 is formed in a disk shape with an outside diameter equivalent to the furnace opening flange 16. The seal cap 20 is moved up and down by a boat elevator (not shown in drawing). A rotation mechanism (rotating shaft motor) 40 for rotating a boat 21 (described later) is installed at the seal cap 20 so that a rotating shaft (R shaft) 41 passes through the seal cap 20. An isolation flange 42 functioning as a cover for covering the entire surface at the processing chamber 14 side of the seal cap 20 is installed to rotate as one piece with the rotating shaft 41. The rotating shaft 41 and the isolation flange 42 are both made of metal (for example high nickel alloys with high corrosion resistance such an alloy of 50 percent or more nickel, 15 to 30 percent chromium, and 15 to 30 percent or more molybdenum).

Figure 3A:
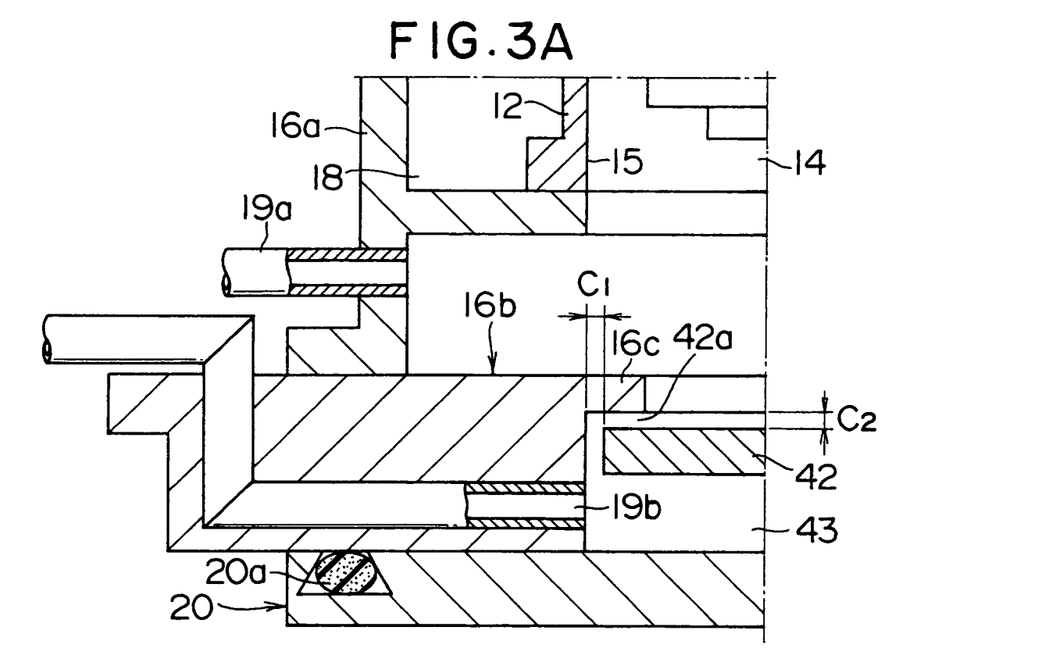
FIG. 3A is an enlarged cross sectional view showing the flow outlet section in detail.

In the state (boat loading) in which the boat 21 is loaded into the processing chamber 14 of the reaction furnace 39 as shown in FIG. 2, a small chamber 43 is formed by the lower surface of the isolation flange 42, the upper surface of the seal cap 20, and the inner circumferential surface of the base flange 16b. The gas feed pipe 19b installed on the base flange 16b connects to this small chamber 43. A ring-shaped protrusion 16c is formed protruding to the inner side on the upper section of the inner circumferential surface of the base flange 16b. The isolation flange 42 is installed below this protrusion 16c at a position with somewhat of a clearance. The diameter of the isolation flange 42 is smaller than the inside diameter of the base flange 16b, and larger than the internal diameter of the protrusion 16c of the base flange 16b. As shown in FIG. 3A, a slight clearance C1 of approximately 0.5 to 1.5 millimeters is formed between the isolation flange 42 and the base flange 16b. A flow outlet for making the first gas flow into the reaction furnace is formed by this clearance C1, in the small chamber 43. A slight clearance C2 of approximately 1 to 3 millimeters is formed between the isolation flange 42 and the protrusion 16c. An outflow passage 42a is formed by these clearances C1 and C2 for allowing a gas supplied into the small chamber 43 to flow into the processing chamber 14 of the reaction furnace 39.

The boat 21 for holding the wafers 1 as the substrates for processing, is supported by the rotating shaft 41 and vertical and upright along the centerline of the seal cap 20. The boat 21 is totally made of quartz or silicon carbide. The boat 21 is made up of a pair of end plates 22, 23 above and below, and multiple (three members in the figure) support members 24 installed perpendicularly between the pair of end plates 22, 23. Multiple lined support grooves 25 are formed longitudinally and mutually facing each other at equidistant spaces in each support member 24. The outer circumferential edge of the support surface made up of the upward facing surface of each support groove 25 is radially chamfered. The curvature radius of the radial chamfering is set at one or more millimeters. A protrusion in a semispherical shape is formed in the center section of the support surface. The outer circumferential section of the wafers 1 are inserted into the same stage of the support groove 25 between the multiple support members 24. The protrusions on the support surface receive and support the lower circumferential surface at multiple points (three locations in the figure). The multiple wafers 1 respectively supported by each support groove 25 are arrayed horizontally and mutually centered in the boat 21. As shown in FIG. 2, multiple heat blocking plates 26 are supported while arrayed horizontally and mutually centered in a specified region on a side lower than the section facing a heater unit 30 on the lower section of the boat 21. The boat 21 is supported by the rotating shaft 41 installed to pass through the seal cap 20. The boat 21 is rotated by the rotation mechanism 40.

The heater unit 30 for heating the interior of the process tube 11 on the outer section of the outer tube 13, is installed concentrically so as to enclose the periphery of the outer tube 13. The heater unit 30 is structured to heat uniformly over the entire of the process tube 11 or heat to a preset temperature distribution. The heater unit 30 is installed perpendicularly and supported by the case 31 of the CVD device. The reaction furnace 39 is mainly comprised of this heater unit 30, and the process tube 11 including the previously mentioned inner tube 12 and outer tube 13, and the furnace opening flange 16 including the inlet flange 16a and the base flange 16b.

As shown in FIG. 1, the case 31 is provided with a heater unit installation chamber 32 and a standby chamber 33 for standby during the loading/unloading of the boat 21 to and from the processing chamber 14. The standby chamber 33 is the load-lock type (A method for isolating the processing chamber and loading/unloading chamber using an isolation valve such as a gate valve, to prevent air from flowing into the processing chamber, and stabilizing the processing by reducing external disturbances such as temperature and pressure.) and capable of raising a vacuum. An exhaust tube 34 for exhausting the standby chamber 33, and a nitrogen gas feed pipe 35 for supplying nitrogen (N2) gas as the purge gas to the standby chamber 33, are each connected on the side wall of the standby chamber 33 of the case 31. A wafer loading/unloading opening (not shown in drawing) opened and closed by the gate valve, is formed in the other side wall of the standby chamber 33. A boat elevator (not shown in drawing) for raising and lowering the seal cap 20 is installed in the interior of the standby chamber 33.

As one process in the semiconductor device manufacturing method, the film forming method for the process of forming a thin film on the wafer is described next, using the upright thermal CVD device.

As shown in FIG. 1, in the wafer charging step where multiple wafers 1 are loaded in the boat 21, the boat 21 is in standby in the standby chamber 33. The multiple wafers 1 are loaded in the boat 21 by the wafer transfer equipment. The standby chamber 33 is purged at this time by nitrogen gas supplied from the nitrogen gas supply tube 35.

In the boat loading step for loading the boats 21 loaded with a specified number of wafers 1 into the processing chamber 14, the boat 21 is lifted by the boat elevator, the boat 21 is loaded from the furnace opening 15 of the inner tube 12 into the processing chamber 14 of the reaction furnace 39, and as shown in FIG. 2, is placed in the processing chamber 14 in a state supported via the rotating shaft 41 by the seal cap 20 with the furnace opening 15 sealed hermetically.

In the state where the boat 21 is placed in the processing chamber 14 of the reaction furnace 39, the seal cap 20 makes direct contact with the base flange 16b via the O-ring 20a, so that the small chamber 43 is formed by the bottom surface of the isolation flange 42 and the top surface of the seal cap 20 and the inner circumferential surface of the base flange 16b. A clearance C1 is formed between the outer circumferential surface of the isolation flange 42 and the inner circumferential surface of the base flange 16b. A clearance C2 is formed between the top surface of the isolation flange 42 and the protrusion 16c on the upper edge of the inner circumferential surface of the base flange 16b. These clearances C1 and C2 form the outflow passage 42a for allowing gas supplied inside the small chamber 43 to flow into the processing chamber 14. The gas feed pipe 19b installed in the base flange 16b connects to the small chamber 43.

In the step for processing the wafer 1 held by the boat 21 in the processing chamber 14, an exhaust pump is connected to the exhaust pipe 17 for evacuating the interior of the processing chamber 14 to a specified vacuum intensity (13.3 to 133 Pa). The heater unit 30 heats the processing chamber to raise the temperature of the wafer 1 to a specified temperature (700 to 800$_i$C, for example 750$_i$C) The boat 21 supporting the wafer 1 is in this case rotated by the rotation mechanism 40 by way of the rotating shaft 41. When the interior of the processing chamber 14 stabilizes to a specified vacuum intensity and temperature of the wafer 1 has stabilized at a specified temperature, the processing gas is then supplied to the processing chamber 14 by the gas feed pipes 19a, 19b.

Figure 3B:
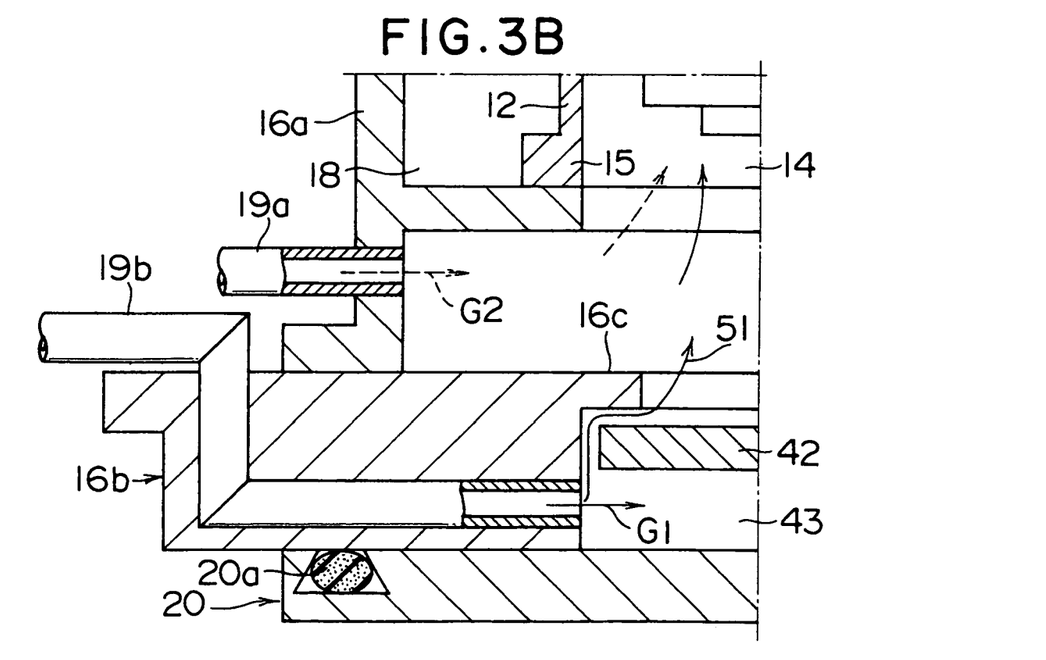
FIG. 3B is an enlarged cross sectional view showing the flow outlet section gas flow.

More specifically, as shown in FIG. 3B, NH3 gas G1 is supplied as the first gas from the feed opening of the gas feed pipe 19b installed on the lower section of the side wall of the base flange 16b, to the small chamber 43 formed by the inner circumferential surface of the base flange 16b and the top surface of the seal cap 20 and the bottom surface of the isolation flange 42. The NE3 gas G1 supplied to this small chamber 43 flows from the flow opening of the clearance C1 formed between the outer circumference of the isolation flange 42 and the inner circumference of the base flange 16b, to the outflow passage 42a formed by the clearances C1, C2 formed between the isolation flange 42 and the base flange 16b and the protrusion 16c, and is supplied from this outflow passage 42a to the processing chamber 14 side. The SiH2Cl2 gas G2 as the second gas on the other hand, is supplied from the feed opening for the gas feed pipe 19a installed on the lower section on the side wall of the inlet flange 16a to the processing chamber 14. The NH3 gas G1 is in this case preferably supplied to the reaction furnace before the SiH2Cl2 gas G2. In other words, the relatively inert gas NH3 gas G1 preferably purges the furnace opening flange 16 and the furnace opening 15 and the interior of the reaction furnace 39 prior to supplying the relatively activated SiH2Cl2 gas G2 to the reaction furnace 39.

The process gas comprised of the SiH2Cl2 gas G2 and NH3 gas G1, rises inside the processing chamber 14 of the inner tube 12. This process gas flows downstream from the upper edge opening of the inner tube 12 and through the exhaust path 18 formed by the clearance between the inner tube 12 and the outer tube 13, and is evacuated from the exhaust pipe 17. The processing gas comprised of the SiH2Cl2 gas G2 and NH3 gas G1 flows onto the wafer 1 heated to the film forming temperature, and a silicon nitride film (Si3N4) is formed by the thermal CVD method.

The supply of process gas comprised of the SiH2Cl2 gas G2 and NH3 gas G1 stops when a preset processing time elapses (silicon nitride film has deposited to a specified film thickness), and the processing chamber 14 is purged by an inert gas such as nitrogen (N2) gas. The N2 gas is at this time supplied from the gas feed pipe 19a or/and the gas feed pipe 19b. Residual gas in the processing chamber 14 is removed by purging with the N2 gas. When the boat 21 stops rotating, the seal cap 20 lowers and the furnace opening 15 of the processing chamber 14 opens, and the group of wafers 1 held in the boat 21 are unloaded from the furnace opening 15 to outside the process tube 11 (boat unloading).

In the film forming process of the prior art, the feed openings of the gas feed pipes 19a, 19b for supplying SiH2Cl2 gas and NH3 gas were all provided in the side wall of the inlet flange 16a, so that byproducts such as NH4Cl (ammonium chloride) were generated in the vicinity of the furnace opening 15 in the lower section of the reaction furnace 39. These byproducts adhered to the low temperature sections on the wall surfaces in the vicinity of the furnace opening 15, and adhered in particular to the upper surface of the seal cap 20, and to the clearance between the seal cap 20 and the rotating shaft 41. When these byproducts form particles and adhere to the upper surface of the wafer 1, they cause a drop in productivity when using the semiconductor device manufacturing method.

The present embodiment however prevents byproducts from adhering in the vicinity of the furnace opening 15 on the lower section of the reaction furnace 39. In other words, as shown in FIG. 3B, along with the NH3 gas G1 being fed into the small chamber 43 formed covering the upper surface of the seal cap 20 by the inner circumferential surface of the base flange 16b and the lower surface of the isolation flange 42, the NH3 gas G1 that was fed into the small chamber 43, also flows from the outflow passage 42a formed by the slight clearance between the isolation flange 42, the base flange 16b and the protrusion 16c to the processing chamber 14 side so that the NH3 gas G1 purges the small chamber 43. Also, the SiH2Cl2 gas G2 is supplied to the upper side of the isolation flange 42 or in other words is supplied downstream of the NH3 gas G1 flow. The SiH2Cl2 gas G2 is in this way prevented from flowing into the small chamber 43, and byproducts such as NH4Cl does not adhere to low temperature sections (section below 150$_t$C) such as the seal cap 20, the clearance between the seal cap 20 and the rotating shaft 41 and the inner side walls of the base flange 16b. Moreover, the reaction of the SiH2Cl2 with the NH3 occurs on the upper section of the furnace opening 15 and the temperature of the inlet flange 16a is at a level (200$_t$C or more) where the NH4Cl does not adhere, and therefore byproducts will also not adhere to the inlet flange 16a. The forming of a source that emits particles can be prevented, and an unexpected drop in productivity in the semiconductor manufacturing process due to particle emission can also be prevented.

Incidentally, the upper temperature of the isolation flange 42 in the above described film forming step is a temperature of 200$_t$C or higher at which the NH4Cl does not adhere to the wall surfaces. However the lower temperature of the isolation flange 42 is 150$_t$C or less which is a temperature where the NH4Cl adheres to the wall surfaces.

The stainless steel is chemical affected by the SiH2Cl2 so that when the SiH2Cl2 gas G2 comes in contact with the stainless steel seal cap 20, there is the worry that the wafer will be contaminated by emission of metal (such as iron or chromium) substances due to the chemical effects on the seal cap 20.

In the present embodiment, the SiH2Cl2 gas G2 as was already described, does not come in contact with the seal cap 20, because the SiH2Cl2 gas G2 does not enter the small chamber 43. Therefore, the seal cap 20 is not chemically affected by the SiH2Cl2 gas G2 even if the seal cap 20 is made of stainless steel. In other words, metal that might cause contamination of the wafer is not emitted from the seal cap 20, even in cases where the seal cap 20 is made from stainless steel.

In the present embodiment, the isolation flange 42 that covers the seal cap 20 is formed from a high nickel alloy that is highly resistant to corrosion as previously described, so that metal that might cause contamination of the wafer is not emitted even if SiH2Cl2 gas G2 makes contact with the isolation flange 42.

Figure 4:
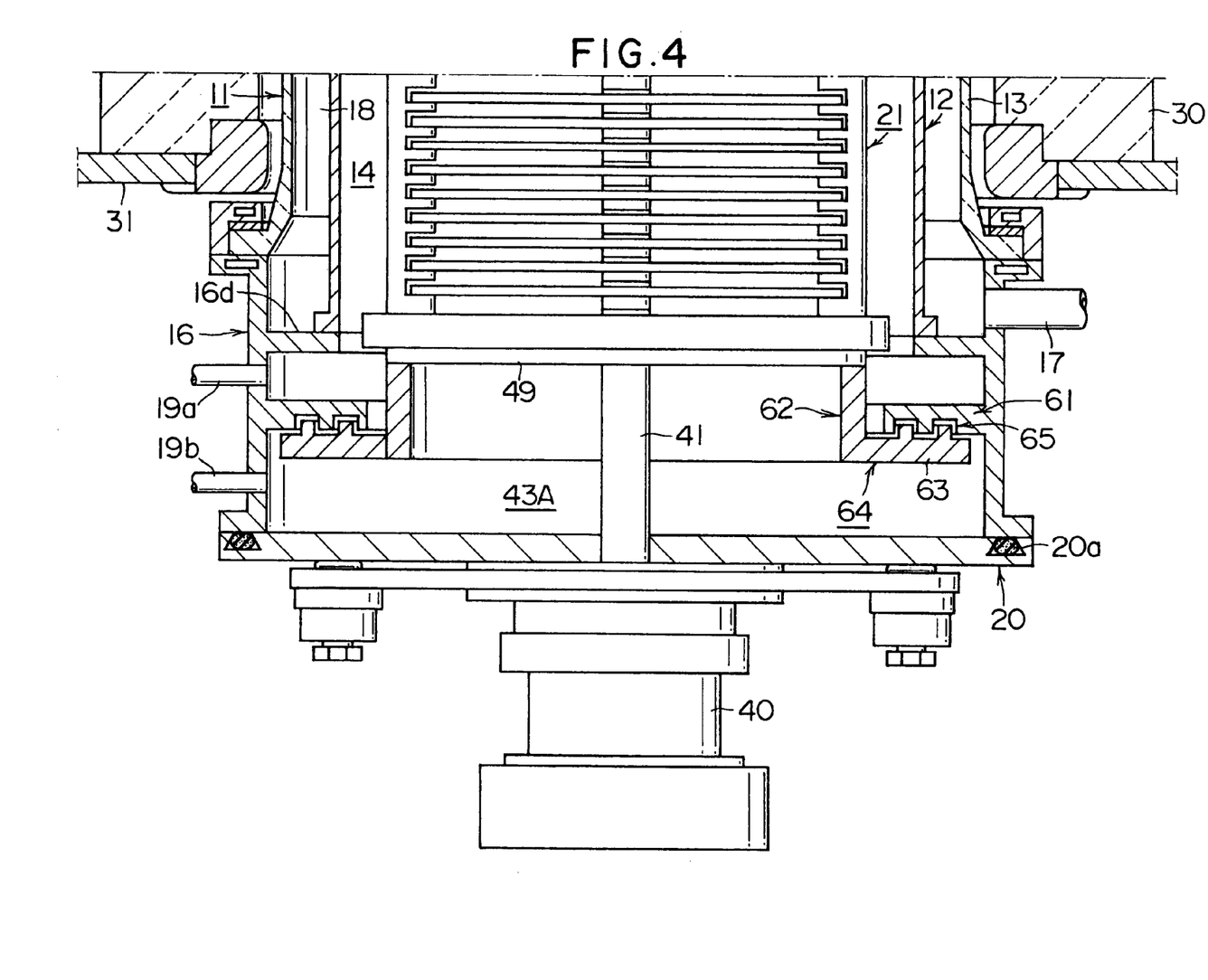
FIG. 4 is a frontal cross sectional view showing in detail, the furnace opening of the reaction furnace of the substrate processing apparatus of the second embodiment of the present invention.
Figure 5A:
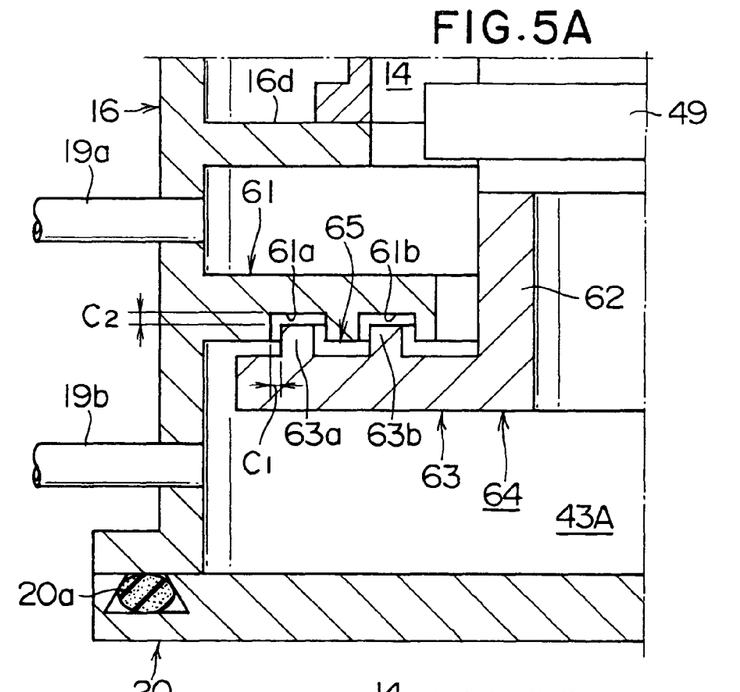
FIG. 5A is an enlarged cross sectional view showing that labyrinth seal section in detail.
Figure 5B:
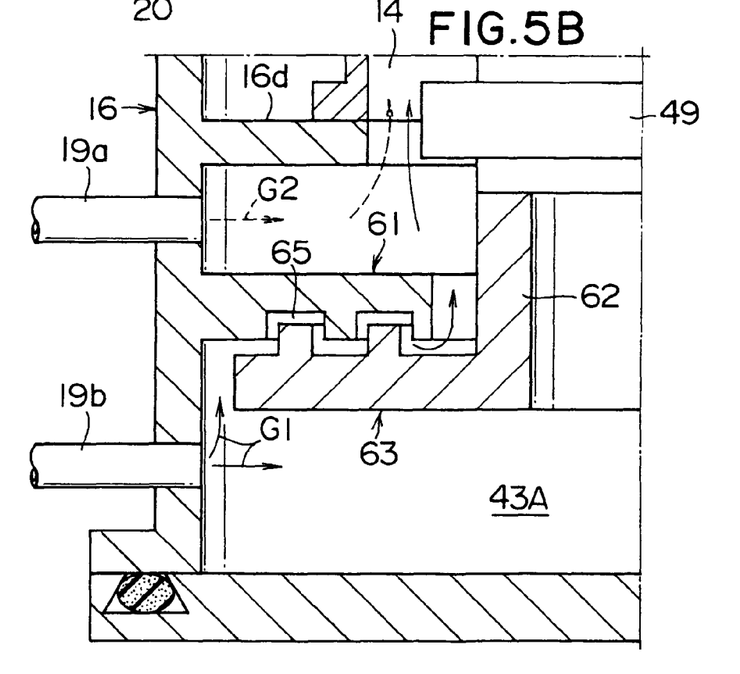
FIG. 5B is an enlarged cross sectional view showing the gas flow in that section.

The second embodiment of the present invention shown in FIG. 4 and FIG. 5 is described next.

Structural parts in the present embodiment that are equivalent to those in the previous embodiment are assigned the same reference numerals and their description is omitted.

An upper divider ring section 61 is provided continuously across the entire circumference below an inner tube mount 16d of the furnace opening flange 16. A boat lower flange 62 on the other side, is installed concentrically with a boat mount 49 on the lower surface of the boat mount 49 horizontally supported on the top edge of the rotating shaft 41. The boat lower flange 62 is formed in a ring shape utilizing a high nickel alloy (for example high nickel alloys of 50 percent or more nickel, 15 to 30 percent chromium, and 15 to 30 percent molybdenum) with high corrosion resistance. A lower divider ring section 63 is formed facing the upper divider ring section 61 on the bottom end of the boat lower flange 62. The upper divider ring section 61 and the lower divider ring section 63 overlap while maintaining a necessary clearance in a specific width. The upper divider ring section 61 and the lower divider ring section 63 make up a cover 64 for covering the entire seal cap 20. A small chamber 43A is formed separate from the processing chamber 14 by the cover 64 on the section below the furnace opening flange 16.

As shown in FIG. 5, a labyrinth seal section 65 is formed as a radially winding clearance in the section where the upper divider ring section 61 and the lower divider ring section 63 overlap. In other words, ring-shaped protruding pieces 63a, 63b are formed concentrically on the upper surface of the lower divider ring section 63. Ring grooves 61a, 61b are formed concentrically with the ring-shaped protruding pieces 63a, 63b on the lower surface of the upper divider ring section 61. The ring-shaped protruding pieces 63a, 63b fit into the ring grooves 61a, 61b by way of the radial clearance C1 and the axial clearance C2. The labyrinth seal section 65 winding radially is comprised of the gap made up of the clearances C1 and C2 between the ring-shaped protruding pieces 63a, 63b, and the ring grooves 61a, 61b. The dimensions of the clearances C1 and C2 of the labyrinth seal section 65 are set within a range allowing mutual rotation by the upper divider ring section 61 and the lower divider ring section 63, and set to a minimum dimension to prevent gas from passing between the small chamber 43A and the processing chamber 14, and to allow outflow of the NH3 gas described later. The labyrinth seal section 65 in other words forms an outflow passage with an outflow passage outlet for allowing the first gas supplied to the small chamber 43A to flow into the reaction furnace. The clearances C1 and C2 of the labyrinth seal section 65 are for example set to dimensions of 0.5 to 3 millimeters.

The function is described next. The wafer processing is the same as the previous embodiment so a description is omitted.

When the boat 21 loaded with wafers is loaded into the processing chamber 14, the seal cap 20 closes to seal the lower end opening of the furnace flange opening 16 hermetically. In this state, the upper divider ring section 61 and the lower divider ring section 63 overlap with the labyrinth seal section 65, and the small chamber 43A is formed between the boat mount 49, the upper divider ring section 61, the lower divider ring section 63, and the seal cap 20.

In the film forming step as shown in FIG. 5B, the NH3 gas G1 is supplied as the first gas, from the gas feed pipe 19b to the small chamber 43A and the SiH2Cl2 gas G2 is supplied as the second gas, from the gas feed pipe 19a to the processing chamber 14. The labyrinth seal section 65 connects the small chamber 43A with the processing chamber 14 and forms a path for flow of the NH3 gas G1 to the processing chamber 14. The NH3 gas G1 flows along the labyrinth seal section (outflow path) 65, and flows from the entire circumference of the upper divider ring section 61 to the processing chamber 14.

The exhaust pipe 17 evacuates the processing chamber 14 so that the processing chamber 14 forms an upward gas flow. The labyrinth seal section 65 winds radially and the resistance of this path restricts the flow of SiH2Cl2 gas G2 into the small chamber 43A.

The C1 and C2 clearance dimensions, the radial length and the number of windings of the labyrinth seal section 65 are set to achieve a state where SiH2Cl2 gas G2 does not flow into the small chamber 43A. If the C1 and C2 clearances are made sufficiently small, then the ring-shaped protruding pieces 63a, 63b of the lower divider ring section 63 as well as the ring grooves 61a, 61b of the upper divider ring section 63 or in other words the labyrinth seal section 65 may be eliminated.

Incidentally, separating the seal cap 20 from the heater unit 30 causes a low temperature (below 150$_t$C) to be reached where NH4Cl is emitted. Therefore when the NH3 gas G1 and the SiH2Cl2 gas G2 mix in the vicinity of the seal cap 20, the NH4Cl adheres to and accumulates on the surface of the seal cap 20, etc. The present embodiment suppresses a reaction between the NH3 gas G1 and the SiH2Cl2 gas G2 in the low temperature section comprised by the small chamber 43A, comprised by the small chamber 43A, by supplying NH3 gas G1 to the small chamber 43A separating from the processing chamber 14, and supplying SiH2Cl2 gas G2 to the processing chamber 14 side. NH4Cl is in this way prevented from being generated in low temperature sections. Moreover, byproducts such as NH4Cl that results from reactions are prevented from adhering to and depositing on the seal cap 20 and the furnace opening flange 16.

The present embodiment prevents reaction byproducts from adhering to the low temperature sections of the furnace opening flange 16 so that servicing of the furnace opening such as cleaning of the furnace opening flange 16 can be drastically reduced, and routine servicing can be performed at longer intervals. For example, service tasks that were performed at intervals of approximately one month, can in this embodiment be extended to once every three months or once a year.

The NH3 gas and the SiH2Cl2 gas can be separated in the low temperature section so that the installation position and shape of the upper divider ring section 61 and the lower divider ring section 63 need not be restricted to those described in the present embodiment. For example, the lower divider ring section 63 may be installed onto the rotating shaft 41, and may be installed on the seal cap 20.

Figure 6:
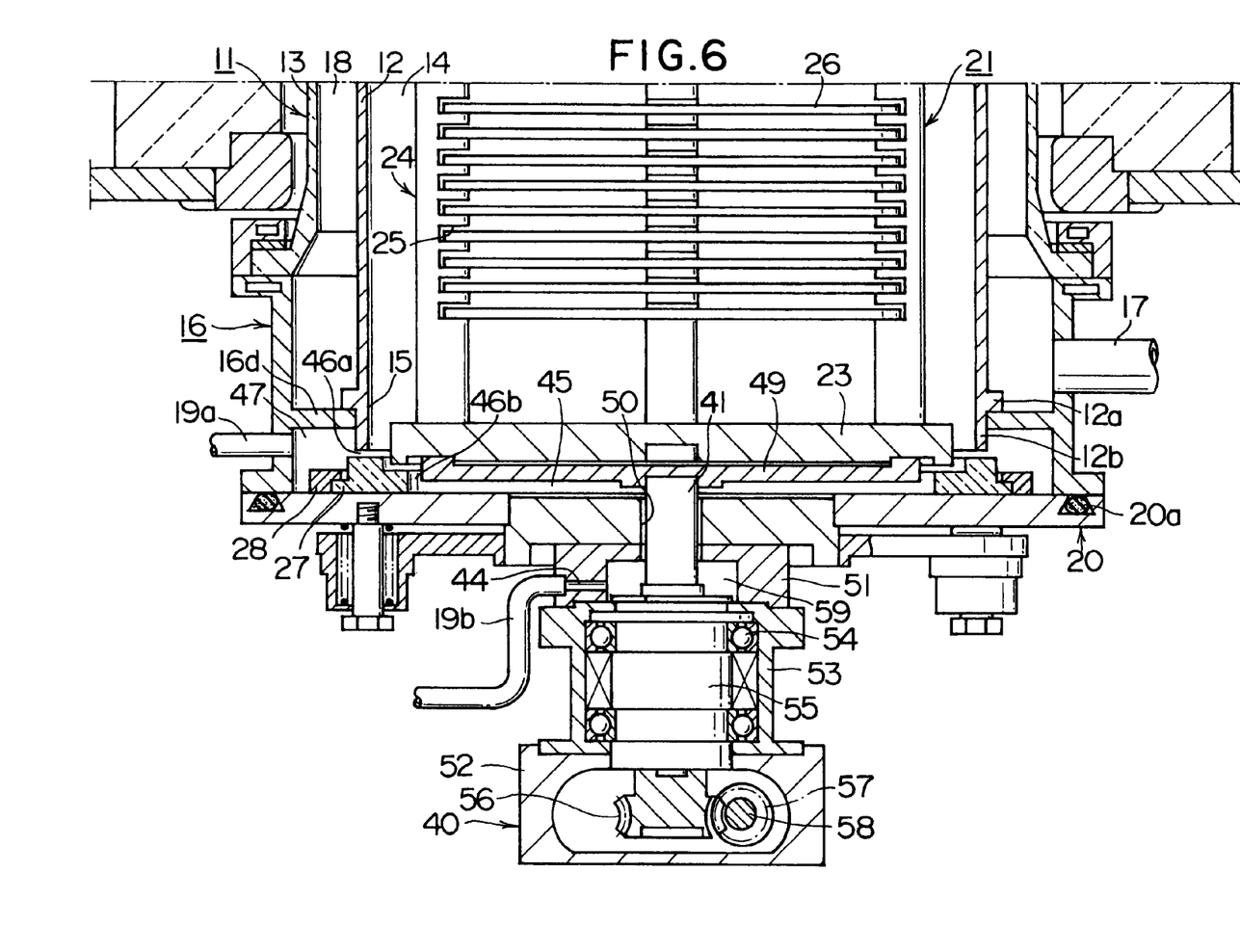
FIG. 6 is a frontal cross sectional view showing in detail, the furnace opening of the reaction furnace of the substrate processing apparatus of the third embodiment of the invention.
Figure 7:
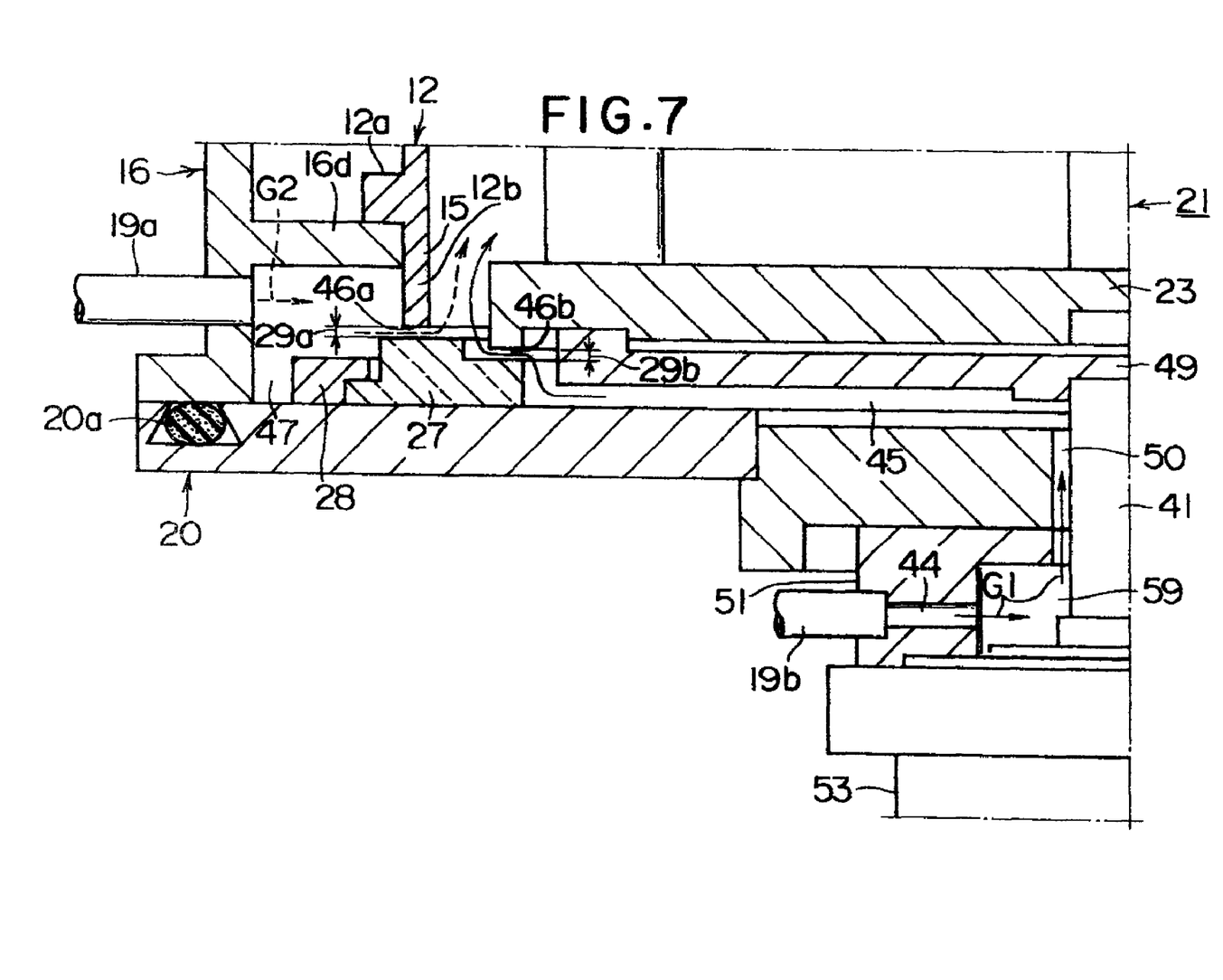
FIG. 7 is an enlarged cross sectional view showing the gas flow in that divider ring section.

The third embodiment of the present invention is described next as shown in FIG. 6 and FIG. 7.

Structural parts in the present embodiment that are equivalent to those in the previous embodiment are assigned the same reference numerals and their description is omitted.

A protrusion 12a connecting across the entire circumference is provided on the outer circumferential surface of the bottom end of the inner tube 12. Installing the protrusion 12a on an inner tube mount 16d connecting across the entire circumference on the internal circumference of the furnace opening flange 16, makes the inner tube 12 support on the furnace opening flange 16. An extending section 12b extends below the protrusion 12a of the inner tube 12. A divider ring 27 made from quartz glass or silicon carbide (SiC) is installed as a ring-shaped plate member below the extending section 12b on the seal cap 20. The divider ring 27 is secured to the seal cap 20 by a clamp ring 28. The clearances 29a, 29b of approximately 0.1 to 3 millimeters form a sealing mechanism (labyrinth seal) between the divider ring 27 and the extending section 12b of the inner tube 12, and between the divider ring 27 and the end plate 23 of the boat 21. The dimensions of the clearances 29a, 29b are preferably 2 millimeters or less.

In the state where the boat 21 is loaded into the processing chamber 14 of the reaction furnace 39, a small chamber (hereafter, called the second small chamber) 47 is formed by the seal cap 20 and the furnace opening flange 16 and the extending section 12b of the inner tube 12 and the divider ring 27. One end of a gas feed pipe (hereafter called the second gas feed pipe) 19a for supplying the second gas is connected to the second small chamber 47. The other end of the second gas feed pipe 19a is connected to a supply source (not shown in drawing) for the second gas such as SiH2Cl2 gas or inert gas. The opening at the tip (blow vent) of the second gas feed pipe 19a therefore forms a feed opening for supplying the second gas into the reaction furnace. The furnace opening flange 16 is also referred to as a second cover.

Also in the state where the boat 21 is loaded into the processing chamber 14 of the reaction furnace 39, a small chamber (hereafter, called the first small chamber) 45 is formed by the seal cap 20 and the divider ring 27, and the end plate 23 on the lower side of the boat 21 and the boat mount 49. A gas feed pipe (hereafter called a first gas feed pipe) 19b for supplying a first gas connects to the first small chamber 45 via a space 59 and a clearance 50. A clearance 29b is formed between the end plate 23 on the lower side of the boat 21 and the divider ring 27. A flow outlet 46b is formed by the clearance 29b for allowing the gas supplied to the first small chamber 45 to flow into the processing chamber 14 of the reaction furnace 39. A clearance 29a is formed between the extending section 12b of the inner tube 12 and the divider ring 27. A flow outlet 46a is formed by the clearance 29a for allowing the gas supplied to the second small chamber 47 to flow into the processing chamber 14 of the reaction furnace 39. The boat mount 49 and the end plate 23 are also referred to as a first cover.

A housing 53 of the rotation mechanism 40 is fastened by way of the base flange 51 to the seal cap 20. A gear case 52 is fastened at the bottom end of the housing 53. A lower section rotating shaft 55 is installed on the housing 53 for free rotation via a shaft bearing 54. The bottom end of the lower section rotating shaft 55 is exposed into the interior of the gear case 52. A worm wheel 56 is installed at the bottom end of the lower section rotating shaft 55. A worm 57 is installed on the worm wheel 56 for free rotation on the gear case 52. The rotating shaft 58 of the worm 57 connects to a boat rotation motor not shown in the drawing.

The rotating shaft 41 passing through the seal cap 20 is affixed in the space 59 concentrically with the lower section rotating shaft 55. The boat mount 49 is installed at the upper end of the rotating shaft 41. The boat 21 is set and clamped on the boat mount 49. The desired clearance 50 is formed between the seal cap 20 and the base flange 51 and the rotating shaft 41. A gas feed path 44 passing through the space 59 is formed in the side surface of the base flange 51. The first gas feed pipe 19b is connected to the gas feed path 44, and therefore the gas feed path 44 connects to a supply source (not shown in drawing) such as inert gas or NH3 gas as the first gas. The space 59 is formed adjacent to the rotating shaft 41 below the seal cap 20, and connects to the gas feed path 44 and the space 50. Therefore the opening on the downstream side of the clearance 50 forms a feed opening for supplying the first gas to the first small chamber 45.

The function is described next. The wafer processing is the same as the previous embodiment so a description is omitted.

When the boat 21 loaded with wafers is loaded into the processing chamber 14, the seal cap 20 closes to seal the lower end opening of the furnace opening flange 16 hermetically. In this state, the first gas feed pipe 19b installed on the side wall of the base flange 51 connects via the space 59 and the clearance 50 to the first small chamber 45 enclosed by the seal cap 20 and the divider ring 27 and the end plate 23 on the lower side of the boat 21 and the boat mount 49.

In the step for processing the wafer 1 supported in the boat 21 in the processing chamber 14, the boat 21 holding the wafer 1 is rotated by the rotating shaft 41 of the rotation mechanism 40. When the interior of the processing chamber 14 is stabilized at a specified vacuum intensity, and when the temperature of the wafer 1 stabilizes to the specified temperature, the process gas is supplied from the gas feed pipes 19a, 19b to the processing chamber 14.

More specifically, NH3 gas G1 as shown in FIG. 7, is supplied as the first gas from the first gas feed pipe 19b connected to the side wall of the base flange 51, via the gas feed path 44 to the space 59, and from the space 59 flows via the clearance 50 from the feed opening of the clearance 50 to the first small chamber 45. The NH3 gas G1 supplied to the first small chamber 45, is supplied to the processing chamber 14 from the flow outlet 46b comprised of the clearance 29b formed between the divider ring 27 and the end plate 23 on the lower side of the boat 21. The SiH2Cl2 gas G2 is supplied as the second gas from the feed opening of the second gas feed pipe 19a connected to the lower section on the side wall of the furnace opening flange 16, to the second small chamber 47 enclosed by the seal cap 20 and the furnace opening flange 16 and the extending section 12b of the inner tube 12 and the divider ring 27. The SiH2Cl2 gas G2 supplied to this second small chamber 47 is supplied to the processing chamber 14 from the flow outlet 46a comprised of the clearance 29a formed between the divider ring 27 and the extending section 12b of the inner tube 12. In this case, NH3 gas G1 is supplied to the reaction furnace 39 prior to the SiH2Cl2 gas G2. In other words, the furnace opening section and the interior of the reaction furnace 39 is preferably purged with NH3 gas G1 before supplying the SiH2Cl2 gas G2.

The present embodiment can prevent reaction byproducts such as NH4Cl from adhering to sections in the vicinity of the furnace opening flange 15 of the reaction furnace 39 in the film forming step. In other words, as shown in FIG. 7, the NH3 gas G1 is supplied to the first small chamber 45 enclosed by the seal cap 20 and the divider ring 27 and the end plate 23 on the lower side of the boat 21, and the boat mount 49 via the slight clearance 50 between the rotating shaft 41 and the seal cap 20, and the supplied NH3 gas G1 diffuses (is supplied) to the processing chamber 14 from the flow outlet 46b comprised of the clearance 29b. In other words, the NH3 gas G1 purges the first small chamber 45. Also, the SiH2Cl2 gas G2 is supplied into the second small chamber 47 enclosed by the seal cap 20 and the furnace opening flange 16 and the extending section 12b of the inner tube 12 and the divider ring 27, and the supplied SiH2Cl2 gas G2 is supplied into the processing chamber 14 from the flow outlet 46a made up of the slight clearance 29a. In other words, the SiH2Cl2 gas G2 purges the second small chamber 47. The inflow of SiH2Cl2 gas G2 into the first small chamber 45 is in this way restricted, and the inflow of NH3 gas G1 into the second small chamber 47 is in this way restricted so that byproducts such as NH4Cl are prevented from adhering to the upper surface of the seal cap 20 and the clearance 50 between the seal cap 20 and the rotating shaft 41, and the inner circumferential surface of the furnace opening flange 16.

The processing chamber 14 where the NH3 gas G1 as the first gas flowing out from the first flow outlet 46b, mixes and reacts with the SiH2Cl2 gas G2 as the second gas flowing out from the second flow outlet 46a is comprised of the divider ring 27 and the inner tube 12 and the outer tube 13 and the end plate 23 on the lower side of boat 21. These components are all made from non-metallic materials such as quartz. No metallic members are used in the processing chamber 14 so that no metallic contamination occurs.

Moreover, providing an extending section 12b extending downwards from the protrusion 12a, to install the inner tube 12 in the furnace opening flange 16, results in only a slight clearance 29a between the divider ring 27 and the extending section 12b of the inner tube 12. This slight clearance 29a prevents the NH3 gas G1 from flowing into the second small chamber 47, and makes it difficult for byproducts to adhere to the inner circumferential surface of the furnace opening flange 16.

Figure 8:
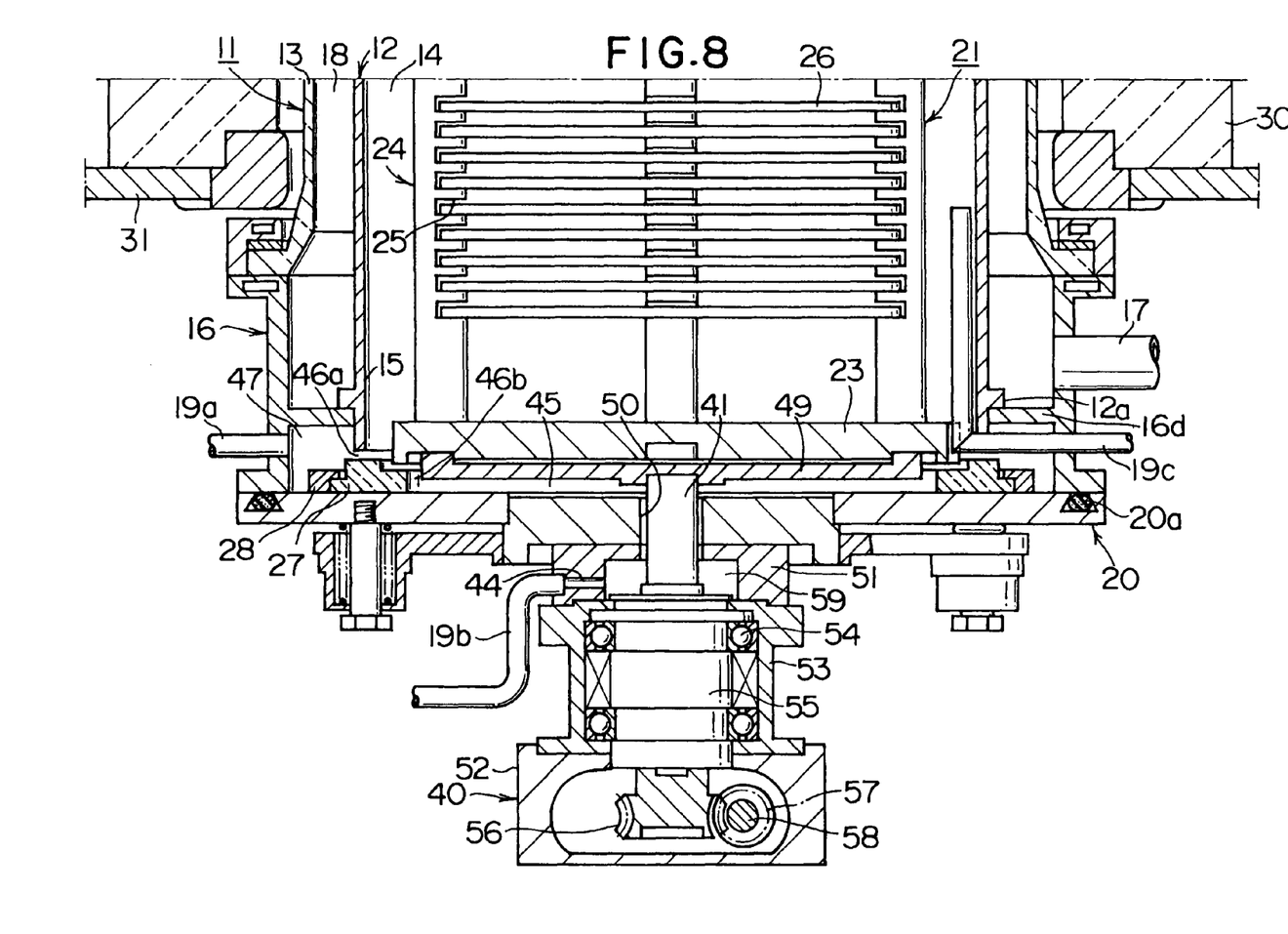
FIG. 8 is a frontal cross sectional view showing in detail, the furnace opening of the reaction furnace of the substrate processing apparatus of the fourth embodiment of the invention.

The fourth embodiment of the present invention is described next while referring to FIG. 8.

The present embodiment differs from the third embodiment in the point that a gas feed pipe 19c (Hereafter called the third gas feed pipe.) for supplying the third gas G3 to the processing chamber 14 is inserted into the furnace opening flange 16. The gas feed opening of the tip opening (blow vent) of the third gas feed pipe 19c is installed downstream (upwards) of the flow outlet 46a, 46b. Gas supplied from the gas feed opening of the third gas feed pipe 19c mixes downstream of the flow outlets 46a, 46b with the gas flowing from the flow outlets 46a, 46b.

The third embodiment contains the additional third gas feed pipe 19c and can therefore handle three or more types of gases.

When using two types of gases, the same gas is preferably supplied from the first gas feed pipe 19b and the second gas feed pipe 19a, while the other gas is supplied from the third gas feed pipe 19c.

For example when using NH3 gas and SiH2Cl2 gas as the same as in the third embodiment, the NH3 gas which has relatively little chemical effect on metal members is supplied from the first gas feed pipe 19b and from the second gas feed pipe 19a, and the SiH2Cl2 gas (corrosive gas) which tends to easily apply chemical effects to metal members is supplied from the third gas feed pipe 19c. The SiH2Cl2 gas which is a corrosive gas therefore only comes in contact with non-metallic member such as quartz and never makes contact with metal members. Metallic contamination occurring due to corrosive gas contacting metal member can therefore be reliably prevented. The fourth embodiment that emphasizes preventing metal contamination is in this point more advanced than the other embodiments that center mainly on preventing NH4Cl from adhering to low temperature sections such as the rotating shaft and the top surface of the seal cap.

The fifth embodiment of this invention is described next while referring to FIG. 9.

Structural parts in the present embodiment that are equivalent to those in the previous embodiment are assigned the same reference numerals and their description is omitted.

One end of the gas feed pipe 19a below the inner tube mount 16d of the furnace opening flange 16, connect to the first small chamber 45A which is enclosed by the seal cap 20 and the furnace opening flange 16 and the boat mount 49. A supply source (not shown in drawing) for a second gas such as inert gas or SiH2Cl2 gas, connects to this gas feed pipe 19*a*. The tip opening (blow vent) of the gas feed pipe 19*a* therefore forms a feed opening for supplying the second gas to the first small chamber 45.

The housing 53 of the rotation mechanism 40 is fastened by way of the base flange 51 to the seal cap 20. A gear case 52 is fastened at the bottom end of the housing 53. A lower section rotating shaft 55 is installed on the housing 53 for free rotation via a shaft bearing 54. The bottom end of the lower section rotating shaft 55 is exposed into the interior of the gear case 52. The worm wheel 56 is installed at the bottom end of the lower section rotating shaft 55. The worm 57 is installed on the worm wheel 56 for free rotation in the gear case 52. The rotating shaft 58 of the worm 57 connects to a boat rotation motor not shown in the drawing.

The rotating shaft 41 passing through the seal cap 20 is affixed in the space 59 concentrically with the lower section rotating shaft 55. The boat mount 49 is installed at the upper end of the rotating shaft 41. The boat 21 is set and clamped on the boat mount 49. The desired clearance 50 is formed between the seal cap 20 and the base flange 51 and the rotating shaft 41. A gas feed path 44 passing through the space 59 is formed in the side surface of the base flange 51. The first gas feed pipe 19*b* is connected to the gas feed path 44, and therefore the gas feed path 44 connects to a supply source (not shown in drawing) such as inert gas or NH3 gas as the first gas. The space 59 is formed adjacent to the rotating shaft 41 below the seal cap 20, and connects to the gas feed path 44 and the clearance 50. The opening on the downstream side of the clearance 50 therefore forms a feed opening for supplying the first gas to the first small chamber 45.

The function is described next. The wafer processing is the same as the previous embodiment so a description is omitted.

When the boat 21 holding the wafers is loaded into the processing chamber 14, the seal cap 20 closes to seal the lower end opening of the furnace opening flange 16 hermetically. In this state, the first gas feed pipe 19*b* connected to the side wall of the base flange 51 connects via the space 59 and the clearance 50 to the first small chamber 45A enclosed by the seal cap 20 and the furnace opening flange 16 and the boat mount 49.

In the step for processing the wafer 1 supported in the boat 21 in the processing chamber 14, the boat 21 holding the wafer 1 is rotated by the rotating shaft 41 of the rotation mechanism 40. When the interior of the processing chamber 14 is stabilized at a specified vacuum intensity, and when the temperature of the wafer 1 stabilizes to the specified temperature, the process gas is supplied from the gas feed pipes 19*a*, 19*b* to the processing chamber 14.

Figure 9:
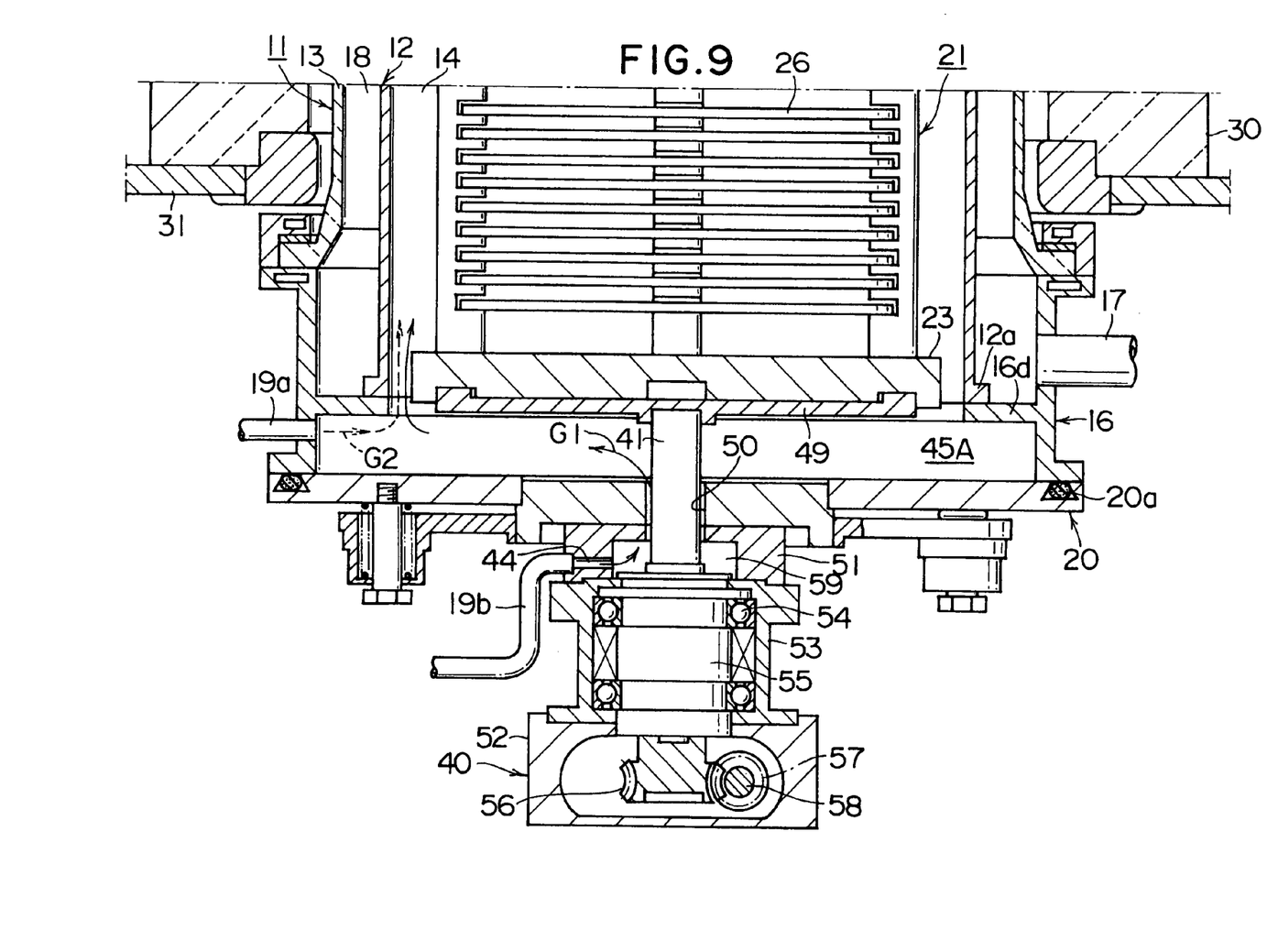
FIG. 9 is a frontal cross sectional view showing in detail, the furnace opening of the reaction furnace of the substrate processing apparatus of the fifth embodiment of the invention.

More specifically, the NH3 gas G1, as shown in FIG. 9, is supplied as the first gas from the first gas feed pipe 19*b* connected to the side wall of the base flange 51, via the gas feed path 44 to the space 59, and from the space 59 flows via the clearance 50 to the first small chamber 45A. The NH3 gas G1 supplied to the first small chamber 45A, is supplied to the processing chamber 14. Also, the SiH2Cl2 gas G2 as the second gas is supplied from the second gas feed pipe 19*a* connected to the lower section on the side wall of the furnace opening flange 16, to the first small chamber 45A. The NH3 gas G1 is in this case supplied to the reaction furnace 39 prior to the SiH2Cl2 gas G2. In other words, the interior of the reaction furnace 39 and furnace opening section are preferably purged with NH3 gas G1 before supplying the SiH2Cl2 gas G2.

The present embodiment can prevent NH4Cl byproducts from adhering to sections in the vicinity of the furnace opening 15 of the reaction furnace 39 in the film forming step. In other words, the NH3 gas G1 is supplied to the first small chamber 45A enclosed by the seal cap 20 and the furnace opening flange 16 and the boat mount 49 via the slight clearance 50 between the rotating shaft 41 and the seal cap 20, and the supplied NH3 gas G1 diffuses (is supplied) to the processing chamber 14. The SiH2Cl2 gas G2 therefore cannot easily flow into the rotation mechanism 40 and elsewhere due to the outflow of NH3 gas G1 from the slight clearance 50 of the rotating shaft 41, so that byproducts such as NH4Cl can be prevented from adhering to the clearance 50 at the rotating shaft 41.

This invention is not limited by the above embodiments and needless to say, changes of different types not departing from the spirit and the scope of this invention are allowed.

For example, this invention is not limited to the process for forming Si3N4 film and film forming processes for other films may be utilized.

When forming the SiO2 film (LTO (low temperature oxide) film) using silane (SiH4) and oxygen (O2), the O2 gas may be used as the first gas, and the SiH4 gas may be used as the second gas.

Moreover, this invention can be applied to self-cleaning (task of removing byproducts and film deposited on the reaction furnace and members inside the reaction furnace) using gases such as ClF3, NF3, F2.

The inert gas nitrogen (N2) gas or argon (Ar) gas may be used as the first gas, and the cleaning gases such as ClF3, NF3, F2 may be utilized as the second gas. In this case, corrosion of the metal sections on the furnace opening can be prevented.

This invention is further not limited to an upright thermal CVD device containing a process tube made up of an inner tube and outer tube, and may be utilized in other CVD devices comprising a process tube containing only an outer tube, or to diffusion devices or to oxidizing devices.

A diffusion device for diffusing impurities may use a dilute gas of nitrogen (N2) gas as the first gas, and impurity gas of PH3 gas or B2H6 gas and AsH3 as the second gas.

An oxidizing device may use oxygen (O2) as the first gas, and hydrogen (H2) gas as the second gas.

What is claimed is:

1. A substrate processing apparatus comprising:
   a reaction furnace for processing a substrate;
   a seal cap for sealing an opening of the reaction furnace hermetically;
   a first cover installed within the hermetically sealed furnace so as to be separate from the seal cap so as to cover at least a section of the surface of the seal cap which faces the inner side of the reaction furnace;
   a first small chamber formed by the seal cap and the first cover,
   a first feed opening for supplying a first gas to the first small chamber;
   a first flow outlet provided in the first small chamber for making the first gas flow into the reaction furnace;
   a second cover installed within the hermetically sealed furnace so as to be separate from the inner wall surface of the lower section of the reaction furnace so as to cover at least a portion of the inner wall surface of the lower part of the reaction furnace;
   a second small chamber formed by the second cover and the inner wall surface of the lower part of the reaction furnace;

a second feed opening for supplying a second gas that is different from the first gas to the second small chamber; and a second flow outlet provided in the second small chamber for allowing the second gas to flow into the reaction chamber, wherein the first flow outlet is configured to substantially prevent inflow of the second gas into the first small chamber, and wherein the first gas and the second gas are simultaneously supplied into the reaction furnace.

2. The substrate processing apparatus according to claim 1, wherein a ring-shaped member is installed on the seal cap, the first small chamber is formed by the seal cap and the first cover and the ring-shaped member; and the second small chamber is formed by the inner wall surface of the lower part of the reaction furnace and the second cover and the ring-shaped member.

3. The substrate processing apparatus according to claim 2, wherein the first flow outlet is formed by a clearance between the first cover and the ring-shaped member; and the second flow outlet is formed by a clearance between the second cover and the ring-shaped member.

4. The substrate processing apparatus according to claim 3, comprising a boat for holding multiple substrates approximately horizontally at intervals in multiple stages, wherein the reaction furnace includes a process tube comprised of an inner tube and an outer tube, and a furnace opening flange for supporting the process tube; and the first cover is comprised of an end plate on the lower side of the boat, and the second cover is comprised of an extending section of the inner tube extending downwards from the protrusion for installing the inner tube on the furnace opening flange.

5. The substrate processing apparatus according to claim 1, wherein there is no member fabricated of metal inside the processing chamber for mixing the first gas flowing from the first flow outlet with the second gas flowing from the second flow outlet.

6. The substrate processing apparatus according to claim 1, comprising a boat for holding multiple substrates approximately horizontally at intervals in multiple stages, and a rotation mechanism for supporting and rotating the boat by way of a rotating shaft penetrating through the seal cap, wherein the first feed opening for supplying the first gas is formed by a clearance between the seal cap and the rotating shaft.

7. The substrate processing apparatus according to claim 1, wherein the first gas is ammonia, and the second gas is dichlorosilane, and a silicon nitride film is formed on the substrate by the thermal CVD method in the processing.

8. A substrate processing apparatus comprising:
a reaction furnace for processing a substrate;
a seal cap for sealing an opening of the reaction furnace hermetically;
a first cover installed within the hermetically sealed furnace so as to be separate from the seal cap so as to cover at least a section of the surface of the seal cap which faces the inner side of the reaction furnace;
a first small chamber formed by the seal cap and the first cover,
a first feed opening for supplying a first gas to the first small chamber;
a first flow outlet provided in the first small chamber for allowing the first gas to flow into the reaction furnace;
a second cover installed within the hermetically sealed furnace so as to be separate from the inner wall surface of the lower section of the reaction furnace so as to cover at least a portion of the inner wall surface of the lower part of the reaction furnace;
a second small chamber formed by the second cover and the inner wall surface of the lower part of the reaction furnace;
a second feed opening for supplying a second gas to the second small chamber;
a second flow outlet provided in the second small chamber for allowing the second gas to flow into the reaction chamber, and
a third feed opening provided further downstream than the flow of gas from the first flow outlet and the flow of gas from the second flow outlet for supplying a third gas that is different from the first gas and the second gas into the reaction furnace, wherein
the inflow of the third gas into the first small chamber and the second small chamber is restricted by the configuration of the first and the second flow outlets so as to prevent substantially any inflow of the third gas into the first and the second small chambers, and the first, second and third gases are simultaneously supplied into the reaction furnace.

9. The substrate processing apparatus according to claim 8, wherein the first gas and the second gas are ammonia, and the third gas is dichlorosilane, and a silicon nitride film is formed on the substrate by the thermal CVD method in the processing.

* * * * *